US012720772B2

(12) United States Patent
Kang et al.

(10) Patent No.: US 12,720,772 B2
(45) Date of Patent: Aug. 25, 2026

(54) HYBRID MEMORY ON FRONT AND BACKSIDE OF A WAFER

(71) Applicant: International Business Machines Corporation, Armonk, NY (US)

(72) Inventors: Tsung-Sheng Kang, Ballston Lake, NY (US); Tao Li, Slingerlands, NY (US); Ruilong Xie, Niskayuna, NY (US); Takashi Ando, Eastchester, NY (US)

(73) Assignee: International Business Machines Corporation, Armonk, NY (US)

( * ) Notice: Subject to any disclaimer, the term of this patent is extended or adjusted under 35 U.S.C. 154(b) by 671 days.

(21) Appl. No.: 18/312,711

(22) Filed: May 5, 2023

(65) Prior Publication Data

US 2024/0373654 A1 Nov. 7, 2024

(51) Int. Cl.
*H10B 80/00* (2026.01)

(52) U.S. Cl.
CPC .................................... *H10B 80/00* (2023.02)

(58) Field of Classification Search
CPC ........ H10B 80/00; H10B 12/50; H10B 63/30; H10B 63/80; H10B 12/315; H10D 88/00; H10N 70/20; H10N 70/231; H10N 70/826
USPC ............................................... 365/72, 230.06
See application file for complete search history.

(56) References Cited

U.S. PATENT DOCUMENTS 6,317,365 B1 * 11/2001 Tanaka .................. G11C 11/405 365/189.04
7,569,894 B2 * 8/2009 Suzuki ................... H10D 89/10 257/370
7,741,188 B2 * 6/2010 Dyer ...................... H10D 1/716 438/386
7,961,547 B2 * 6/2011 Kanari .................. G11C 11/412 365/189.04
8,361,875 B2 1/2013 Zhu
8,759,947 B2 6/2014 Tan
9,419,003 B1 * 8/2016 Colinge ............... H10D 64/252
9,780,210 B1 * 10/2017 Goktepeli ......... H01L 21/28518
10,312,229 B2 * 6/2019 Moroz ................. H10D 62/122
10,483,321 B2 11/2019 Wang
10,593,778 B1 * 3/2020 Basaran ................. H10D 48/01
10,607,938 B1 * 3/2020 Rubin .................. H10D 86/011
10,763,267 B2 * 9/2020 Chong .................... H10D 89/10
11,054,461 B1 * 7/2021 Chong ............... G01R 31/2851
11,423,204 B1 * 8/2022 Chen ..................... G06F 30/394
2003/0143322 A1 * 7/2003 Ning ...................... H10D 1/692 427/79

(Continued)

FOREIGN PATENT DOCUMENTS

CN 115692443 A * 2/2023

OTHER PUBLICATIONS

Li, et al., "Relaxed Pitch Backside Magneto-Resistive Random Access Memory Integration With Self-Aligned Micro Stud and Backside Power Distribution Network", U.S. Appl. No. 18/148,392, filed Dec. 29, 2022, pp. 42 (Spec + Drawing).

*Primary Examiner* — Michael T Tran
(74) *Attorney, Agent, or Firm* — Gavin Giraud

(57) ABSTRACT

A semiconductor structure includes a semiconductor structure. The semiconductor structure may include a top transistor, a bottom transistor stacked below the top transistor, a back-end-of-line (BEOL) memory device electrically coupled to and above the top transistor, and a backside memory device electrically coupled to and below the bottom transistor.

14 Claims, 13 Drawing Sheets

(56) References Cited

U.S. PATENT DOCUMENTS

2006/0261417 A1* 11/2006 Suzuki ................. H10D 84/907 257/370
2009/0161410 A1* 6/2009 Houston ............... G11C 11/412 365/189.14
2012/0314468 A1* 12/2012 Siau ................... G11C 13/0026 977/755
2014/0131810 A1* 5/2014 Masuoka ............. H10D 84/016 257/369
2018/0061766 A1* 3/2018 Goktepeli ............... H01L 23/66
2018/0062386 A1* 3/2018 Mallikarjunaswamy .................... H02H 9/046
2019/0027535 A1* 1/2019 Kumar ................... H10B 61/00
2019/0189801 A1* 6/2019 Vedula .................. H01L 23/528
2020/0066584 A1* 2/2020 Kao .................. H01L 21/76898
2020/0411078 A1* 12/2020 Sharma ................ H10B 12/315
2021/0098500 A1* 4/2021 Wang ..................... H10D 88/00
2021/0408047 A1 12/2021 Wang
2022/0093616 A1* 3/2022 Wei ...................... H10D 30/794
2022/0122993 A1* 4/2022 Chiu ...................... H10D 89/10
2022/0157956 A1* 5/2022 Chen ................. H01L 21/30604
2022/0173090 A1 6/2022 Gomes
2022/0199624 A1 6/2022 Huang
2022/0223514 A1* 7/2022 Sisodia ............... H01L 23/5226
2022/0285338 A1* 9/2022 Yeh ...................... H10D 89/911
2022/0293513 A1 9/2022 Li
2022/0328399 A1* 10/2022 Preston ................. H01L 23/481
2022/0352179 A1* 11/2022 Yang ...................... H10B 10/12
2022/0367489 A1 11/2022 Chang
2022/0375779 A1* 11/2022 Or-Bach .............. H10D 64/027
2023/0197654 A1* 6/2023 Gomes ................ H01L 25/0657 257/296
2024/0224812 A1 7/2024 Li et al.

* cited by examiner

100

HYBRID MEMORY ON FRONT AND BACKSIDE OF A WAFER

BACKGROUND

The present disclosure generally relates to fabrication methods and resulting structures for semiconductor structures, and more particularly, to a stacked field-effect transistor structure with memory devices on a front side and a back side.

Stacked field-effect transistor (FET) devices, also known as vertically integrated FETs, are a type of semiconductor device where multiple FETs are stacked on top of each other to increase current handling capacity in a semiconductor device and reduce the overall size of the semiconductor device. In a stacked FET, the source of one FET is connected to the drain of the other FET, creating a series connection of FETs. The gate of each FET is isolated from the others, allowing each FET to be controlled independently. When a voltage is applied to the gate of an FET, it creates an electric field that controls the flow of current through the FET.

The advantage of stacking multiple FETs is that the resulting device can handle higher currents without increasing its size, as the stacking arrangement reduces the device's overall resistance. Additionally, stacking FETs can also reduce the on-resistance and switching losses of the device, resulting in improved efficiency and performance.

Stacked FETs are commonly used in power management applications, such as in DC-DC converters, motor drivers, and LED drivers, where high currents need to be controlled with high efficiency and reliability.

SUMMARY

In one embodiment, the present invention may include a semiconductor structure. The semiconductor structure may include a top transistor, a bottom transistor stacked below the top transistor, a back-end-of-line (BEOL) memory device electrically coupled to and above the top transistor, and a backside memory device electrically coupled to and below the bottom transistor.

In one embodiment, the present invention may include, a method of forming a semiconductor structure. The method may include forming a bottom field-effect transistor (FET) with a shallow placeholder under a first source/drain (S/D) and a deep placeholder under a second S/D. The method may also include forming a top FET above the bottom FET, forming a top memory device above and electrically connected to the top FET, exposing the deep placeholder without exposing the shallow placeholder, replacing the deep placeholder with a backside electrode, forming a bottom memory device electrically connected to the backside electrode; exposing the shallow placeholder, and replacing the shallow placeholder with a backside S/D contact (BSCA).

In one embodiment, the present invention may include a semiconductor structure. The semiconductor structure may include a top transistor and a bottom transistor positioned directly below the top transistor. The bottom transistor may include a first source/drain (S/D) electrically connected to a backside S/D contact, an unconnected S/D, a second S/D electrically connected to a bottom memory device, a first gate between the first S/D and the unconnected S/D, and a second gate between the unconnected S/D and the second S/D.

These and other features will become apparent from the following detailed description of illustrative embodiments thereof, which is to be read in connection with the accompanying drawings.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

DETAILED DESCRIPTION

Figure 1:
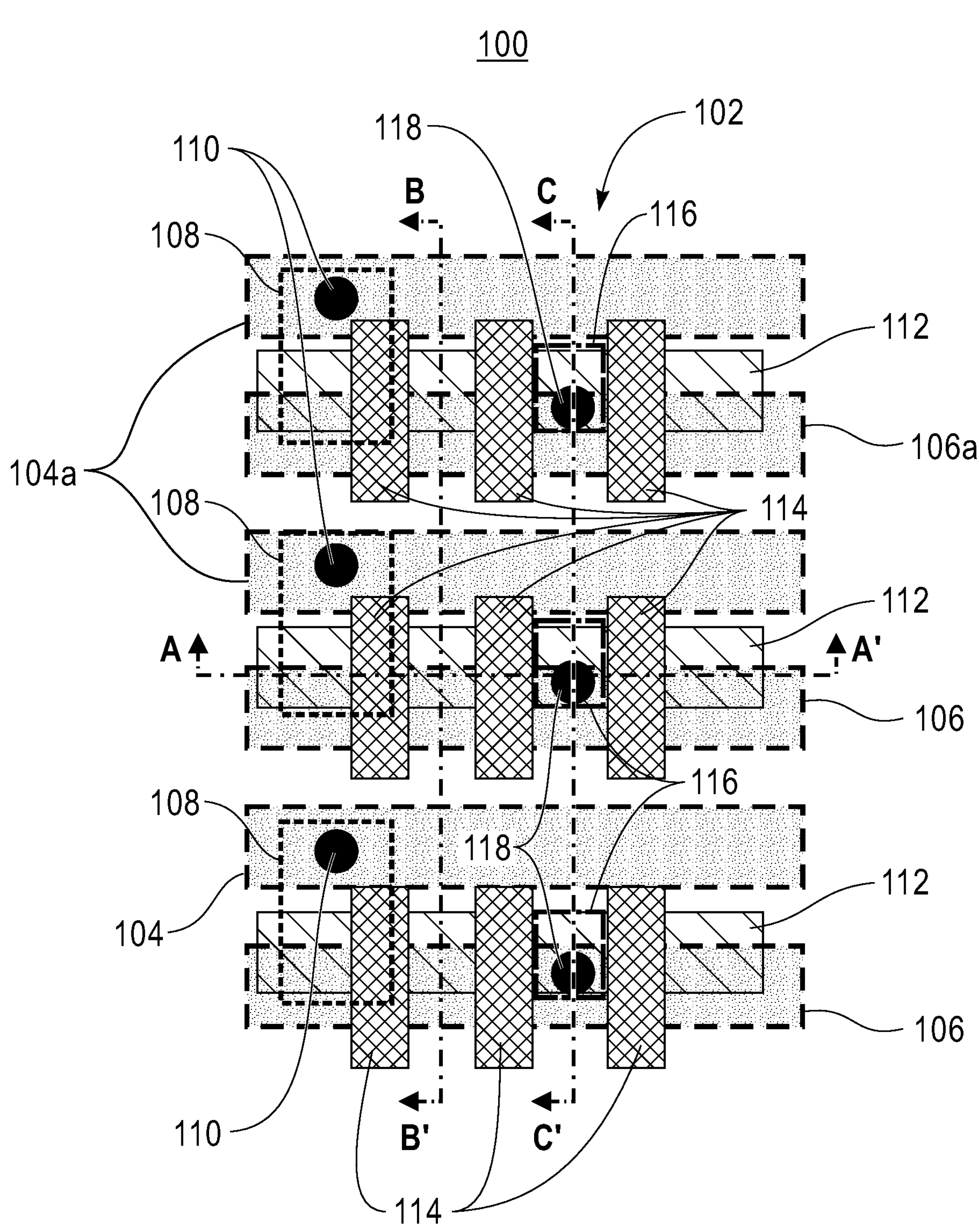
FIG. 1 depicts a cross-sectional top-down view of a semiconductor structure 100, according to an embodiment of the current invention.

In the following detailed description, numerous specific details are set forth by way of examples to provide a thorough understanding of the relevant teachings. However, it should be apparent that the present teachings may be practiced without such details. In other instances, well-known methods, procedures, components, and/or circuitry have been described at a relatively high-level, without detail, to avoid unnecessarily obscuring aspects of the present teachings.

In one aspect, spatially related terminology such as "front," "back," "top," "bottom," "beneath," "below," "lower," above," "upper," "side," "left," "right," and the like, is used with reference to the orientation of the Figures being described. Since components of embodiments of the disclosure can be positioned in a number of different orientations, the directional terminology is used for purposes of illustration and is in no way limiting. Thus, it will be understood that the spatially relative terminology is intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as below. The device may be otherwise oriented (rotated 90 degrees or viewed or referenced at other orientations) and the spatially relative descriptors used herein should be interpreted accordingly.

As used herein, the terms "lateral" and "horizontal" describe an orientation parallel to a first/major surface of a chip. As used herein, the term "vertical" describes an orientation that is arranged perpendicular to the first/major surface of a chip, chip carrier, or semiconductor body.

As used herein, the terms "coupled" and/or "electrically coupled" are not meant to mean that the elements must be directly coupled together—intervening elements may be provided between the "coupled" or "electrically coupled" elements. In contrast, if an element is referred to as being "directly connected" or "directly coupled" to another element, there are no intervening elements present. The term "electrically connected" refers to a low-ohmic electric connection between the elements electrically connected together. Similarly, the terms "above" and/or "below" are not meant to mean that the elements are immediately above or below another element—the level of one element is merely above or below the other element. The terms "directly above" and "directly below," however, mean that one element is directly above another element, with no intervening elements. Additionally, the terms "squarely above" and "squarely below" mean that one element is above/below another element with maximum overlap in a vertical direction. That is, as an example, a first element will have no portions that are not covered by a similarly sized (or larger) element that is squarely above the first element.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. In some embodiments, epitaxial growth and/or deposition processes can be selective to forming on semiconductor surfaces, and may or may not deposit material on other exposed surfaces, such as silicon dioxide or silicon nitride surfaces.

Example embodiments are described herein with reference to cross-sectional illustrations that are schematic illustrations of idealized or simplified embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape of a region of a device and do not limit the scope.

It is to be understood that other embodiments may be used and structural or logical changes may be made without departing from the spirit and scope defined by the claims. The description of the embodiments is not limiting. In particular, elements of the embodiments described hereinafter may be combined with elements of different embodiments.

In some embodiments, etching mask layer(s) may be provided, and the layers that are not protected thereby are removed. For example, as is understood in the art, a mask layer, sometimes referred to as a photomask, may be provided by forming a layer of photoresist material on another layer, exposing the photoresist material to a pattern of light, and developing the exposed photoresist material. An etching process, such as a reactive ion etch (RIE), may be used to form patterns (e.g., openings) by removing portions of another layer. After etching, the mask layer may be removed using a conventional plasma ashing or stripping process. Accordingly, the pattern of the mask layer facilitates the removal of another layer, such as an amorphous SiO2 layer and/or a conductive oxide diffusion barrier, for example, in areas where the mask layer has not been deposited.

For the sake of brevity, conventional techniques related to semiconductor structure and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor structures and semiconductor-based ICs are well known and so, in the interest of brevity, many conventional steps will only be mentioned briefly herein or will be omitted entirely without providing the well-known process details.

Artificial intelligence (AI) models have memory requirements that differ between the training stage and the inference stage. When implementing these AI models, therefore, different types of memory are useful within the same semiconductor structure. A single structure with multiple memory types may be called a "hybrid" memory, and integrating hybrid memories on stacked field-effect transistors (FETs) can provide significant benefits. Memory options for these hybrid memories include phase-change memory (PCM) and resistive random access memory (RRAM). Both PCM and RRAM memories need FET devices that can support voltages higher than 2V, therefore typically these memories use epi-channel vertical gate FinFETs (EG-FETs) to control the memory. EG-FETs require a significant amount of unit cell area in semiconductor structures, which is undesirable. In addition, combining EG-FETs with nanosheet technology is a challenge. The embodiments herein solve these challenges by integrating low voltage memory, such as DRAM, on front side with a surrounding gate FET (SG FET), and high voltage memory, such as RRAM or PCM, on the backside. By connecting the high voltage memory to multiple serially connected SG FETs (2 or more), the semiconductor structure as a whole can sufficiently support higher voltage operation. The embodiments here describe a structure to support both front and back side devices using a common stacked nanosheet FET.

Turning now to the figures, FIG. 1 depicts a cross-sectional top-down view of a semiconductor structure 100, according to an embodiment of the current invention. Specifically, FIG. 1 shows a bottom field-effect transistor (FET) layer 102 with certain components of a first level (M1) of a backside power delivery network (BSPDN), other components may also be present in the bottom FET layer 102, and still be considered embodiments of the present invention. The BSPDN includes negative supply voltage (Vss) metal lines 104 and positive supply voltage (Vdd) metal lines 106. Above the Vss metal lines 104 and the Vdd metal lines 106 (as illustrated at least in FIGS. 15A, B, C below), the bottom FET layer 102 includes backside source/drain (S/D) contacts (BSCAs) 108 with BSCA vias 110 connecting the Vss metal lines 104 to the BSCAs 108. The BSCAs 108 are connected to bottom S/Ds 112 located between bottom gates 114. Additional of the bottom S/Ds 112 may also be connected to bottom memory devices 116 through a bottom memory device via 118. The BSPDN includes additional levels (M2-Mn) in successive layers below the M1 level. The additional levels typically alternate orientation, such that M2 would include metal wires that are perpendicular to the wires of M1, M3 would include metal wires that are perpendicular to the wires of M2 (and parallel to the wires of M1), and so on.

FIG. 1 also illustrates the cross-sectional views used in the figures below (excepting FIG. 2, which is also a top-down view). Line A-A' indicates the location of a cross-sectional view along a row of the semiconductor structure 100, showing three bottom gates 114 and four bottom S/Ds 112, among other things. Line B-B' indicates the location of a cross-sectional view along one column of the semiconductor structure 100, cutting through three bottom S/Ds 112, all of which are not connected to any BSCAs 108 or any bottom memory devices 116. Line C-C' indicates the location of a cross-sectional view along another column of the semiconductor structure 100, cutting through three bottom S/Ds 112, all of which are connected to bottom memory devices 116.

Figure 2:
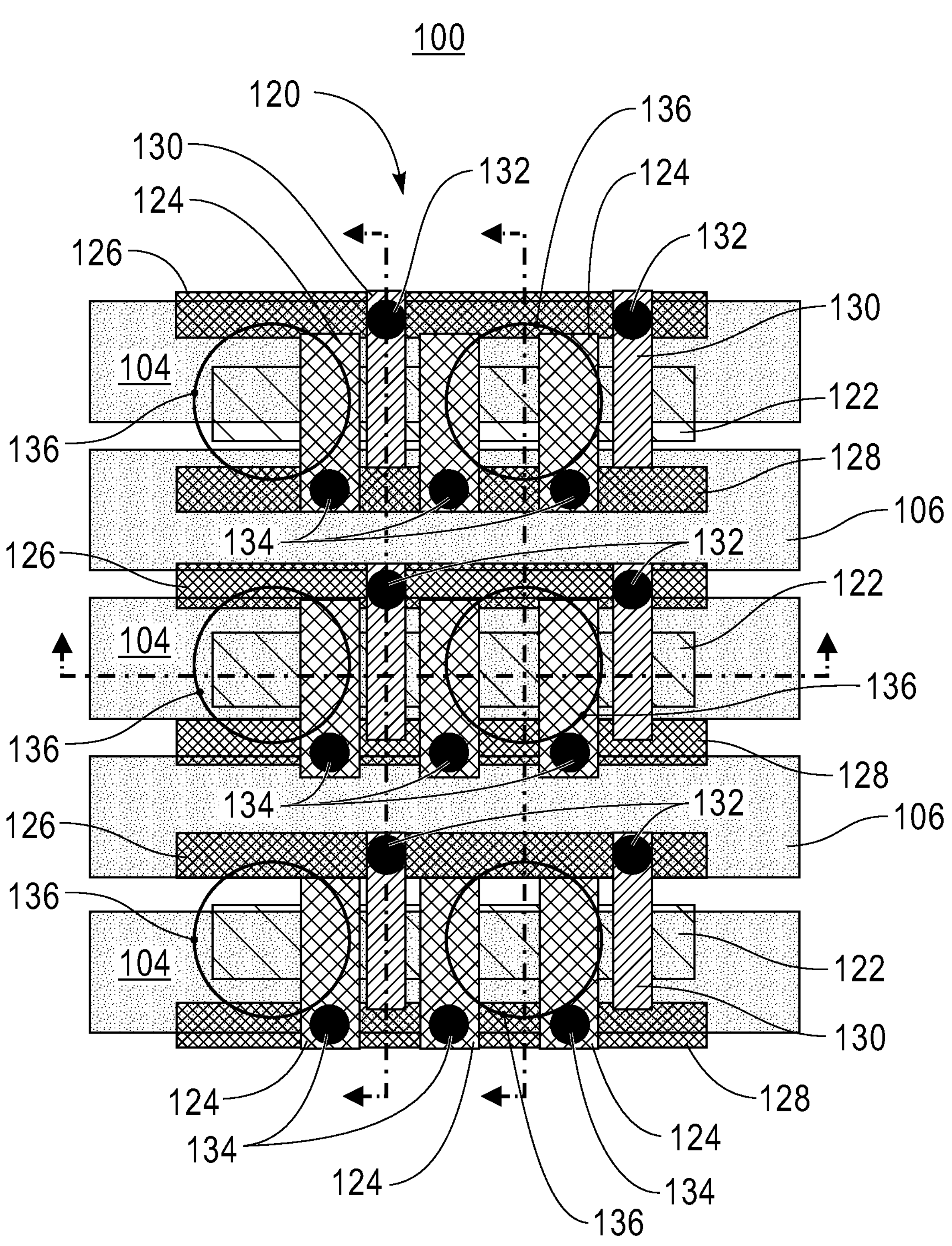
FIG. 2 depicts a cross-sectional top-down view of a semiconductor structure, according to an embodiment of the current invention.

FIG. 2 depicts a cross-sectional top-down view of the semiconductor structure 100, according to an embodiment of the current invention. Specifically, FIG. 2 shows a top FET layer 120 located above the bottom FET layer 102. The top FET layer 120 includes top transistors made up of S/Ds 122 and gates 124, arranged in a similar manner to the bottom transistors: each gate 124 has a S/D 122 on either side. Certain of the S/Ds 122 are electrically coupled to bitlines 126 in a first level (M1) of a back-end-of-line (BEOL) system using S/D contacts (CA) 130 and a CA vias 132. The gates 124 of the top FET layer 120 are electrically coupled to wordlines 128 in the M1 of the BEOL system using gate contact vias 134. Certain of the S/Ds 122 that are not electrically coupled to the bitlines 126 are electrically coupled to top memory devices 136. The top memory devices 136 are further electrically connected to top Vss metal lines 104*a* and/or top Vdd metal lines 106*a*, as illustrated in at least FIGS. 13A, B and C below.

FIG. 2 illustrates the location of the cross-sectional views indicated in FIG. 1 (i.e., the views that are used in the figures below). Line A-A' indicates the location of a cross-sectional view along a row of the semiconductor structure 100. Line B-B' indicates the location of a cross-sectional view along one column of the semiconductor structure 100, and line C-C' indicates the location of a cross-sectional view along another column of the semiconductor structure 100.

Turning now to fabrication of the semiconductor structure 100, the figures below will depict stages of that fabrication, in accordance with one embodiment of the present invention.

Figure 3B:
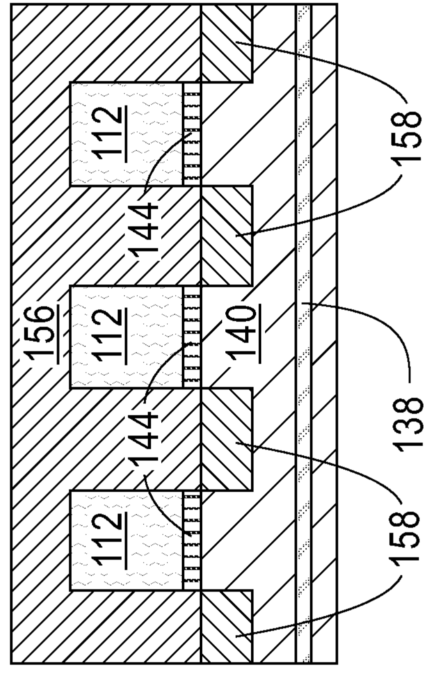
FIGS. 3A-3B depict cross-sectional side views (at the locations indicated in FIGS. 1 and 2) of the semiconductor structure at a stage of fabrication.
Figure 3A:
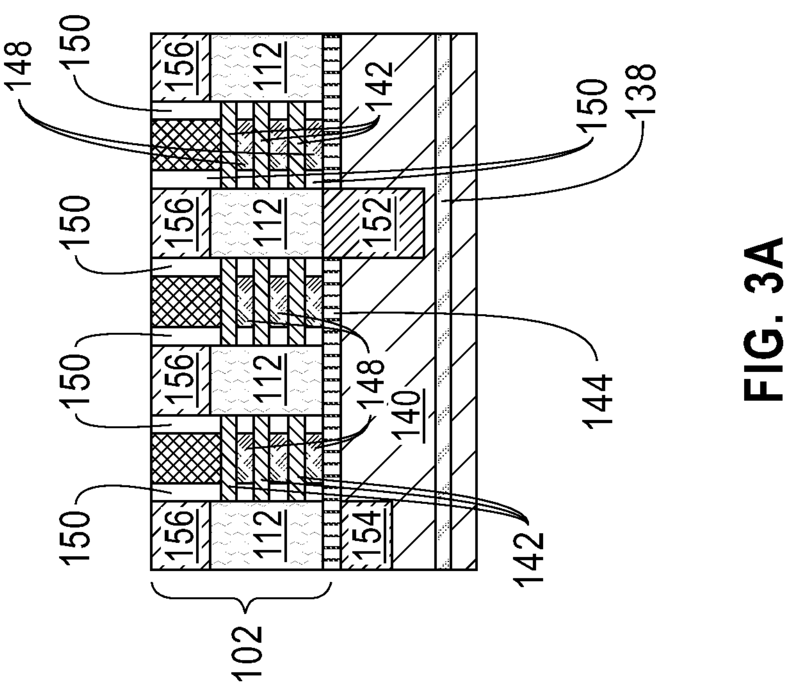

FIGS. 3A-3B depict cross-sectional side views (at the locations indicated in FIGS. 1 and 2) of the semiconductor structure 100 at a stage of fabrication. The view at the C-C' line is redundant and thus not depicted in the FIG. 3 stage (i.e., at this stage the B-B' view shows the same components). The semiconductor structure 100 is fabricated on a substrate 140. The substrate 140 may be silicon, but other materials may also be used. The substrate 140 includes an etch-stop layer 138 to decrease the likelihood of damage during removal of the substrate 140 at a later stage. Above the substrate 140, the semiconductor structure 100 includes nanosheet channels 142 that are separated from the substrate 140 by an isolation layer 144. The nanosheet channels 142 may be fabricated, for example, by forming epitaxial semiconductor layers sequentially above the isolation layer 144. Initially, a layer of silicon and a layer of BOX $SiO_2$ may be fabricated above the substrate 140. Then the layers may epitaxially grown using alternating SiGe dummy layers 148 and nanosheet channels 142 of silicon. Other methods may be used to form the nanosheet channels 142 and the dummy layers 148. Certain embodiments may also include other forms of transistors.

It is understood that the nanosheet channels 142 can include any number of nanosheets alternating with a corresponding number of sacrificial dummy layers 148. For example, the nanosheet channels 142 can include two nanosheets, five nanosheets, eight nanosheets, thirty nanosheets (e.g., 3D NAND), or any number of nanosheets, along with a corresponding number of sacrificial layers (i.e., as appropriate to form a nanosheet stack having a bottom-most sacrificial layer under a bottommost nanosheet and a sacrificial layer between each pair of adjacent nanosheets). The nanosheet channels 142 can be made of any suitable material such as, for example, monocrystalline silicon or silicon germanium. In some embodiments, the nanosheet channels 142 are silicon nanosheets. In some embodiments, the nanosheet channels 142 have a thickness of about 4 nm to about 15 nm, for example 10 nm, although other thicknesses are within the contemplated scope of the present disclosure. In some embodiments, the substrate 140 and the nanosheet channels 142 can be made of a same semiconductor material. In other embodiments, the substrate 140 can be made of a first semiconductor material, and the nanosheet channels 142 can be made of a second and/or third semiconductor material.

Once the silicon layers for the nanosheet channels 142 and the SiGe dummy layers are fabricated for the bottom FET layer 102, individual fins may be cut or etched and inner spacers 150 added to recessed portions of the dummy layers 148. Sacrificial deep placeholders 152 and shallow placeholders 154 may be formed in the semiconductor structure 100 at this time as well. The placeholders 152, 154 can include a photo-sensitive organic polymer having a light-sensitive material that, when exposed to electromagnetic (EM) radiation, is chemically altered and thus configured to be removed using a developing solvent. For example, the photo-sensitive organic polymer can be polyacrylate resin, epoxy resin, phenol resin, polyamide resin, polyimide resin, unsaturated polyester resin, polyphenylenether resin, polyphenylenesulfide resin, or benzocyclobutene (BCB). More generally, for example, the placeholders 152, 154 can include any organic polymer and a photo-active compound having a molecular structure that can attach to the molecular structure of the organic polymer. In some embodiments, the material is selected to be compatible with an overlying antireflective coating (not shown) and/or an overlying photoresist (not shown). In some embodiments, the placeholders 152, 154 can be applied using spin coating technology, although other techniques are within the contemplated scope of the present disclosure. The deep placeholder 152 is formed deeper into the substrate 140 than the shallow placeholder 154, which enables the deep placeholder 152 to be replaced more easily at a stage that is separate from the stage at which the shallow placeholder 154 is replaced, as shown below (i.e., the difference between deep placeholder 152 replacement in FIGS. 11A, B, C and shallow placeholder 154 replacement in FIGS. 13A, B, C).

Other components of the semiconductor structure 100 include shallow trench isolations (STI) 158 in the substrate 140 that isolate the S/Ds 112 from other devices in the semiconductor structure 100. Also, the semiconductor structure 100 may also include spacers 150 that are formed when the SiGe dummy layers 148 are recessed from the direction of the S/Ds 112. The recessions in the dummy layers 148 are filled with a dielectric to form the inner spacers 150. The inner spacers 150 typically do not protrude into the S/D regions and therefore the spacers 150 and the nanosheet channels 142 are flush with each other. The inner spacers 150 may include nitride based material such as silicon boron carbide nitride (SiBCN), SiOCN, SiN, SiOC, etc. or other non-nitride based masking materials.

The bottom S/Ds 112 can be epitaxially formed and/or grown and an ILD 156 can be deposited on top of the S/D 112. Chemical-mechanical polishing (CMP) may also be performed at this stage. The term "epitaxially formed and/or grown" means the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. In some embodiments of the disclosure, epitaxial growth and/or deposition processes can be selective to forming on semiconductor surfaces, and may or may not deposit material on other exposed surfaces, such as silicon dioxide or silicon nitride surfaces. The ILD 156 can be made of any suitable dielectric material, such as, for example, oxides, a low-k dielectric, nitrides, silicon nitride, silicon oxide, SiON, SiC, SiOCN, and/or SiBCN.

Figures 4A, 4B:
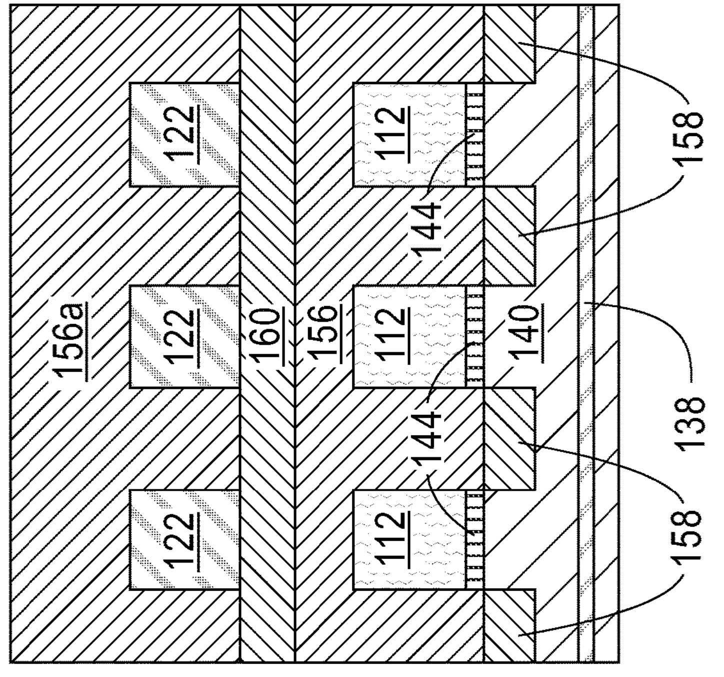
FIGS. 4A-4B depict cross-sectional side views (at the locations indicated in FIGS. 1 and 2) of the semiconductor structure at a stage of fabrication.

FIGS. 4A-4B depict cross-sectional side views (at the locations indicated in FIGS. 1 and 2) of the semiconductor structure 100 at a stage of fabrication. The view along line C-C' is again omitted as redundant. The semiconductor structure 100 includes the top FET layer 120, and a separation substrate 160 added between the bottom FET layer 102 and the top FET layer 120. The top FET layer 120 includes top versions of the components in the bottom FET layer 102, which are formed through similar processes. That is, the top nanosheet channels 142*a* and top dummy layers 148*a* are grown on another substrate (like substrate 140) and then flipped and bonded to the surface of the separation substrate 160. After bonding, the patterning process is applied to form the nanosheet fins, then additional recession and deposition of top inner spacers 150*a*, followed by epitaxially growing top S/Ds 122 and deposition of top ILD 156*a*. The top FET layer 120 may then also include CMP.

Figures 5A, 5B, 5C:
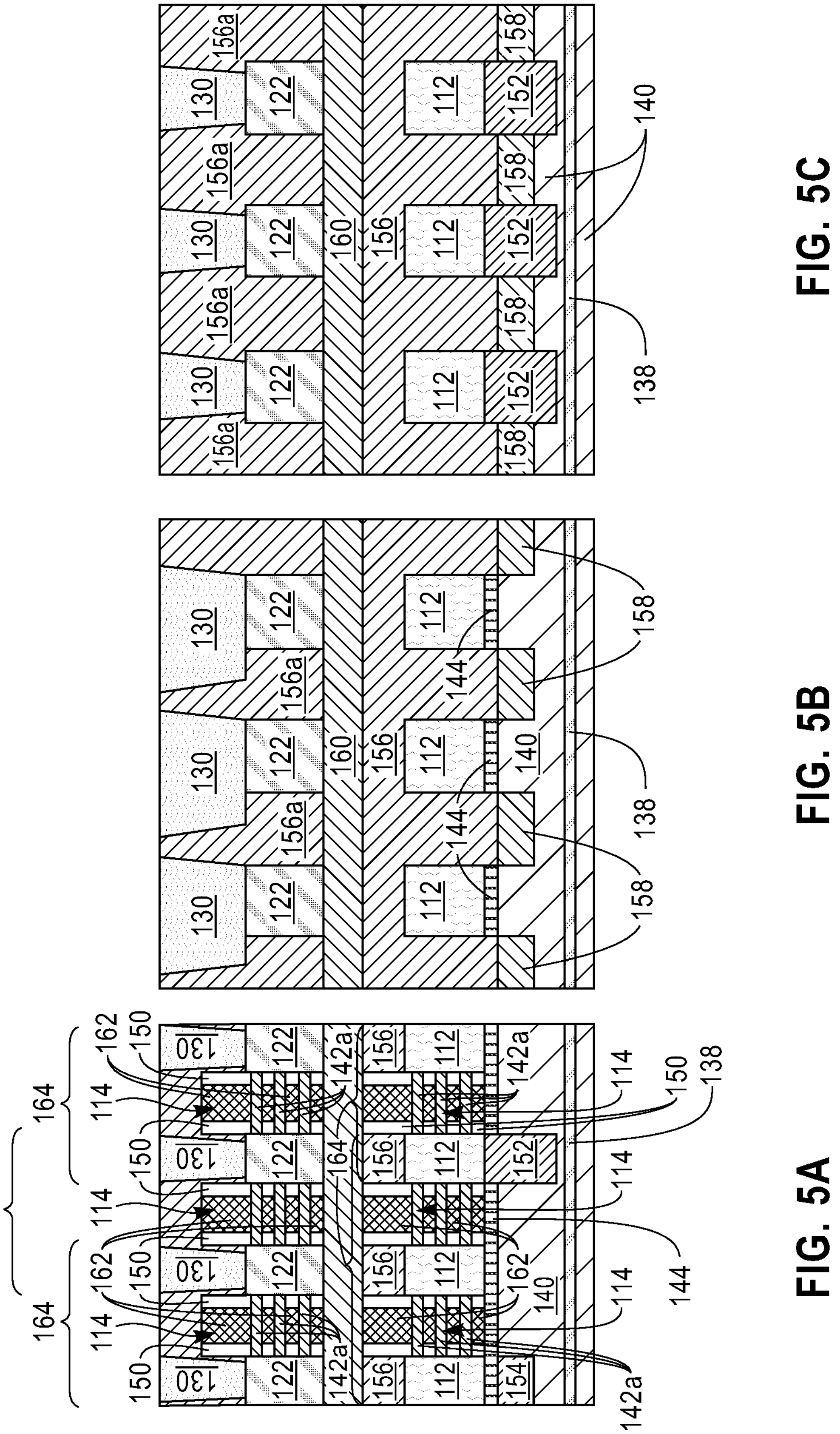
FIGS. 5A-5C depict cross-sectional side views (at the locations indicated in FIGS. 1 and 2) of the semiconductor structure at a stage of fabrication.

FIGS. 5A-5C depict cross-sectional side views (at the locations indicated in FIGS. 1 and 2) of the semiconductor structure 100 at a stage of fabrication. The semiconductor structure 100 includes a high-K metal gate (HKMG) 162 that has replaced the dummy layers 148, and also includes the CAs 130 formed in the ILD 156*a* above the top S/Ds 122. Before formation of the HKMG 162, the dummy layers 148 may be removed by, for example, chemical wet etching.

Regardless of the etch process used to remove the dummy layer 148, the nanosheet channels 142 are not affected by the process, and thus the nanosheet channels 142 become the channel region for transistors 164 that includes a channel region (with one or more of the gates 114) and two S/Ds 112, 122: one on either side of the channel region.

Figures 6A, 6B, 6C:
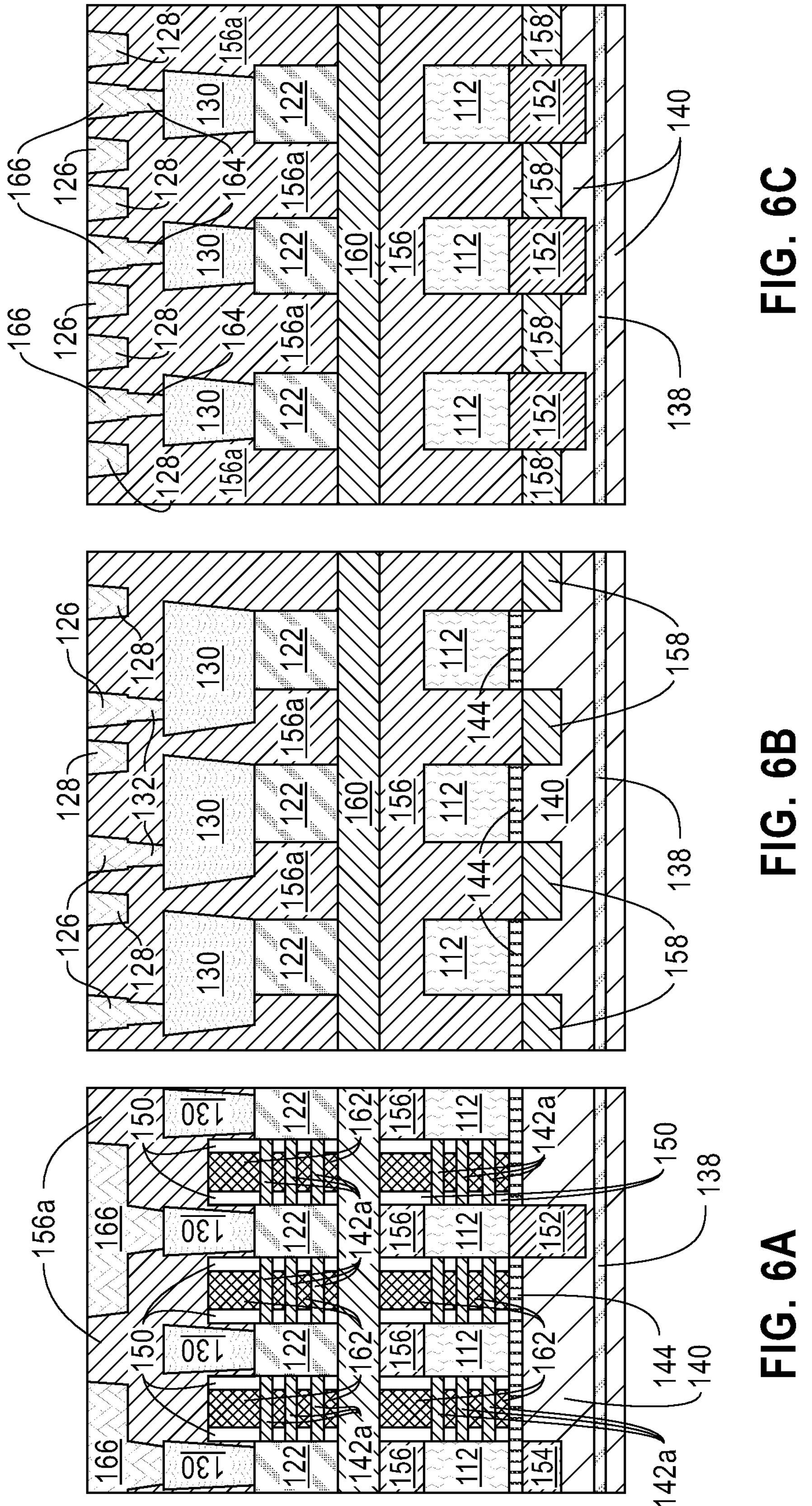
FIGS. 6A-6C depict cross-sectional side views (at the locations indicated in FIGS. 1 and 2) of the semiconductor structure at a stage of fabrication.

FIGS. 6A-6C depict cross-sectional side views (at the locations indicated in FIGS. 1 and 2) of the semiconductor structure 100 at a stage of fabrication. The semiconductor structure 100 includes BEOL via patterning, and BEOL M1 patterning. The BEOL vias include memory vias (VA) 165 and the CA vias 132 etched through the ILD 156*a* to the CA 130. The etching process may include using a hard mask (not shown) and lithographic patterning to create holes for the CA vias 132 and the VAs 165 in the ILDs 156*a*, and then filling the holes with conductive material such as metal. An additional layer of the ILD 156*a* may be subsequently added over the CA vias 132 and VAs 165. Through this additional layer of the ILD 156*a*, a similar process may be used to create the M1 of the BEOL system. Specifically, extended trenches for the bitlines 126 and the wordlines 128 are etched into the additional layer of the ILD 156*a*, and trenches are etched for memory connections 166 above the VAs 165.

Figures 7A, 7B, 7C:
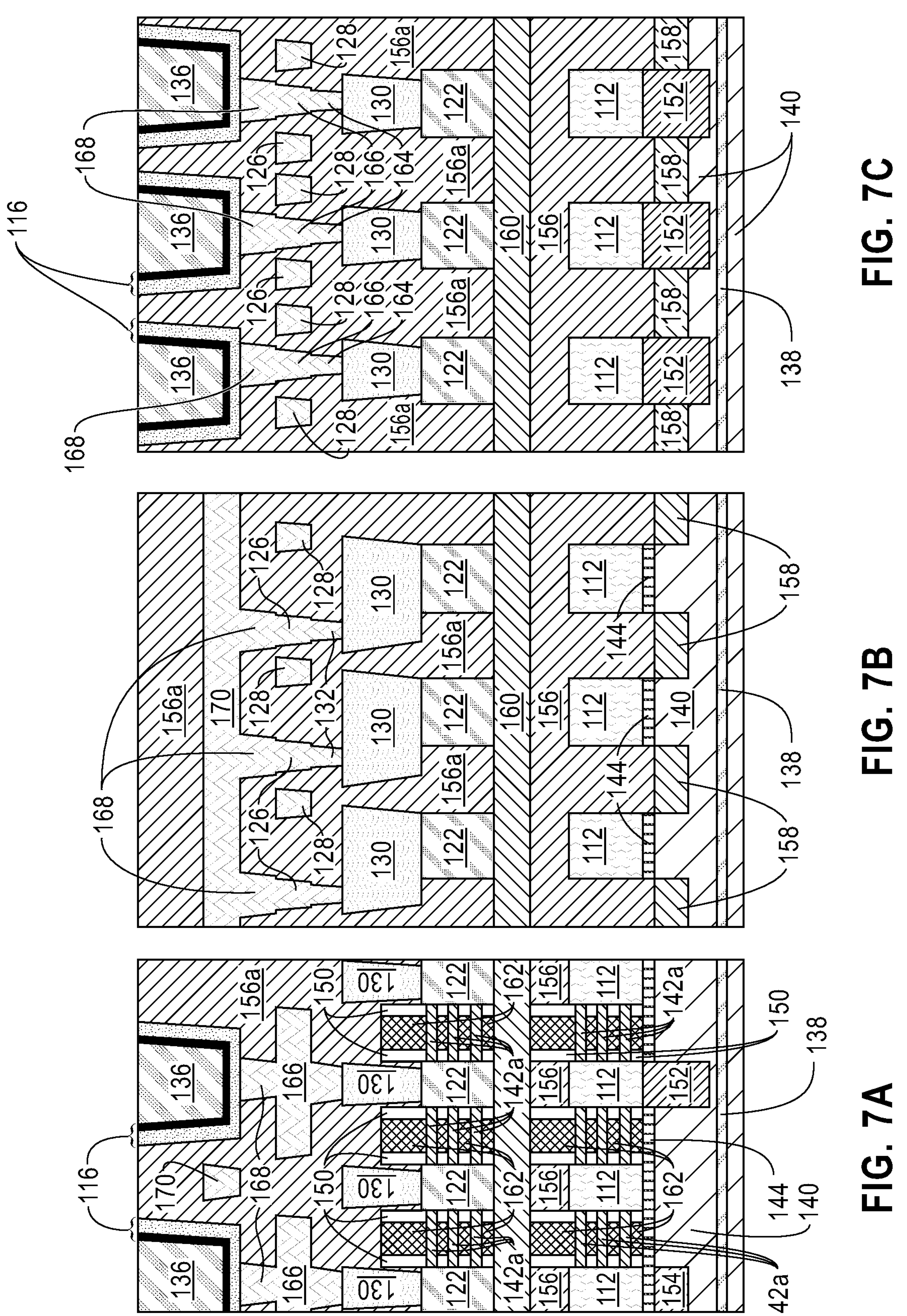
FIGS. 7A-7C depict cross-sectional side views (at the locations indicated in FIGS. 1 and 2) of the semiconductor structure at a stage of fabrication.

FIGS. 7A-7C depict cross-sectional side views (at the locations indicated in FIGS. 1 and 2) of the semiconductor structure 100 at a stage of fabrication. The semiconductor structure 100 includes the top memory devices 136 and a second level (M2) of the BEOL system. The top memory devices 136 are electrically connected to the memory connections 166 by secondary vias (V2) 168, which are formed using lithographic patterning as described above. The top memory devices 136, as illustrated, may include a low-voltage memory device such as a dynamic random access memory (DRAM) device with a metal-insulator-metal (MIM) capacitor to store information using the charge in the structure. In a MIM memory device, two metal layers are separated by an insulating layer, forming a capacitor-like structure. When a voltage is applied to the metal layers, electrons flow through the insulating layer and charge accumulates on the metal layers. The amount of charge stored in the capacitor-like structure determines the state of the memory cell, either a "0" or a "1." To read the state of the memory cell, a small voltage is applied to the metal layers, and the resulting current is measured. If the current is high, it indicates that the capacitor is charged, representing a logic 1. If the current is low, it indicates that the capacitor is discharged, representing a logic 0. The illustrated embodiment of the top memory devices 136 includes a cylindrical MIM memory device.

At the same horizontal level as the top memory devices 136, the M2 level of the semiconductor structure 100 includes second level bitlines 170 and second level wordlines (not illustrated). The M2 level of the bitlines 170 and wordlines is connected to the M1 level of bitlines 126 and wordlines 128 through secondary vias 168 that are formed using a lithographic pattern.

Figures 8A, 8B, 8C:
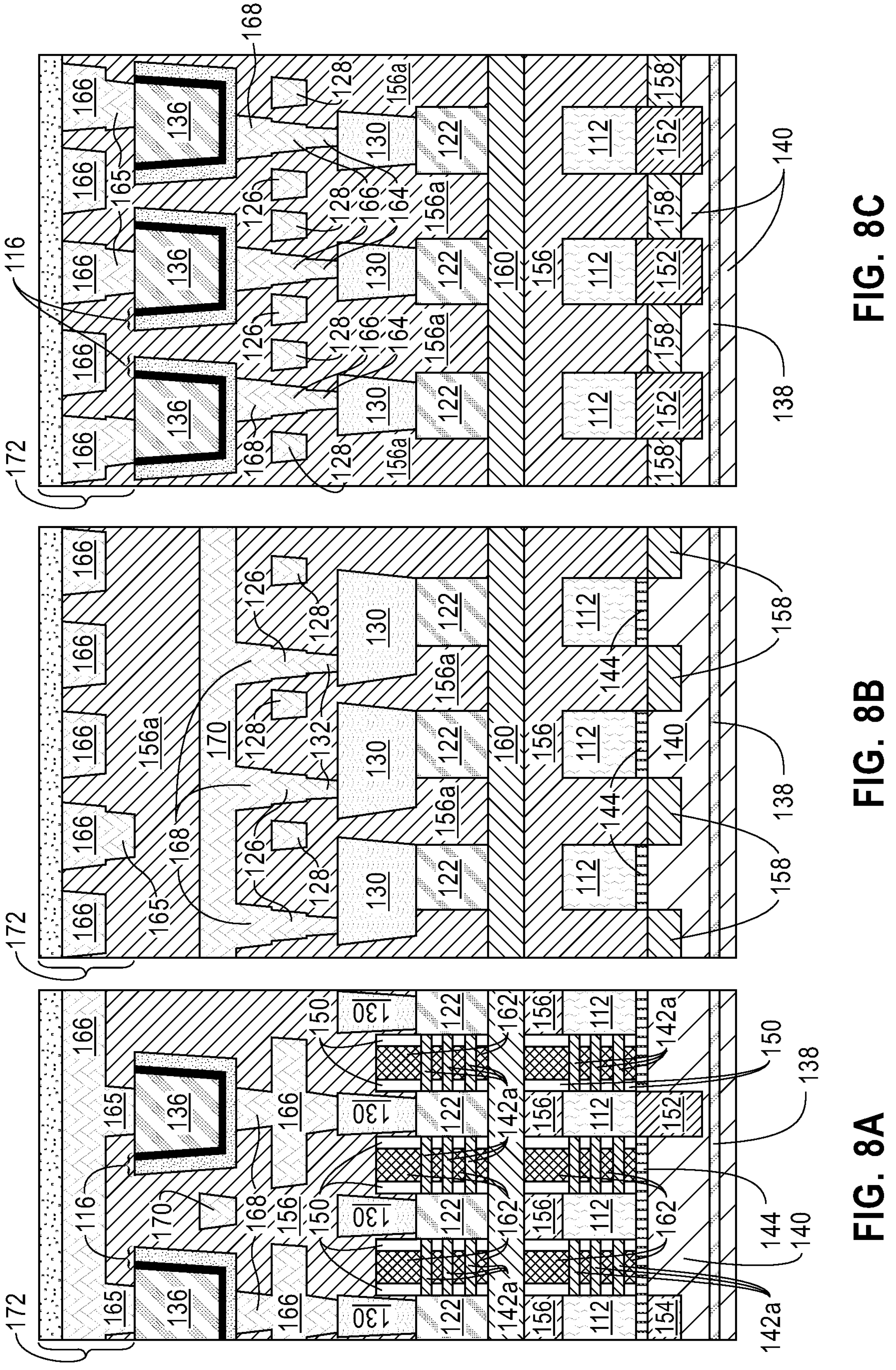
FIGS. 8A-8C depict cross-sectional side views (at the locations indicated in FIGS. 1 and 2) of the semiconductor structure at a stage of fabrication.

FIGS. 8A-8C depict cross-sectional side views (at the locations indicated in FIGS. 1 and 2) of the semiconductor structure 100 at a stage of fabrication. The semiconductor structure 100 includes the remaining layers 172 of the BEOL system. The number of layers and the materials used in the remaining layers 172 of the BEOL system can vary depending on the specific semiconductor technology and device requirements. The process of forming the BEOL is critical for the overall performance of the semiconductor device, as it enables the interconnection of different transistors and other components on the chip. The process of forming the remaining layers 172 reflects the process described above, and may include for example, depositing a layer of ILD 156*a*, typically silicon dioxide or a low-k dielectric material, on top of the completed region below. In this case, the ILD 156*a* is deposited over the M2 level and the top memory devices 136. Then a pattern is applied to the ILD 156*a* using lithography and etching techniques to define the locations of the metal interconnects and additional vias. The next step includes depositing a layer of metal, typically aluminum or copper, on top of the insulating layer, and patterning the metal layer using lithography and etching techniques to form the metal interconnects and vias. These steps are repeated to build additional layers of insulating material, metal interconnects, and vias. Finally, deposit a top layer of insulating material to protect the metal interconnects and complete the BEOL structure.

Figures 9A, 9B, 9C:
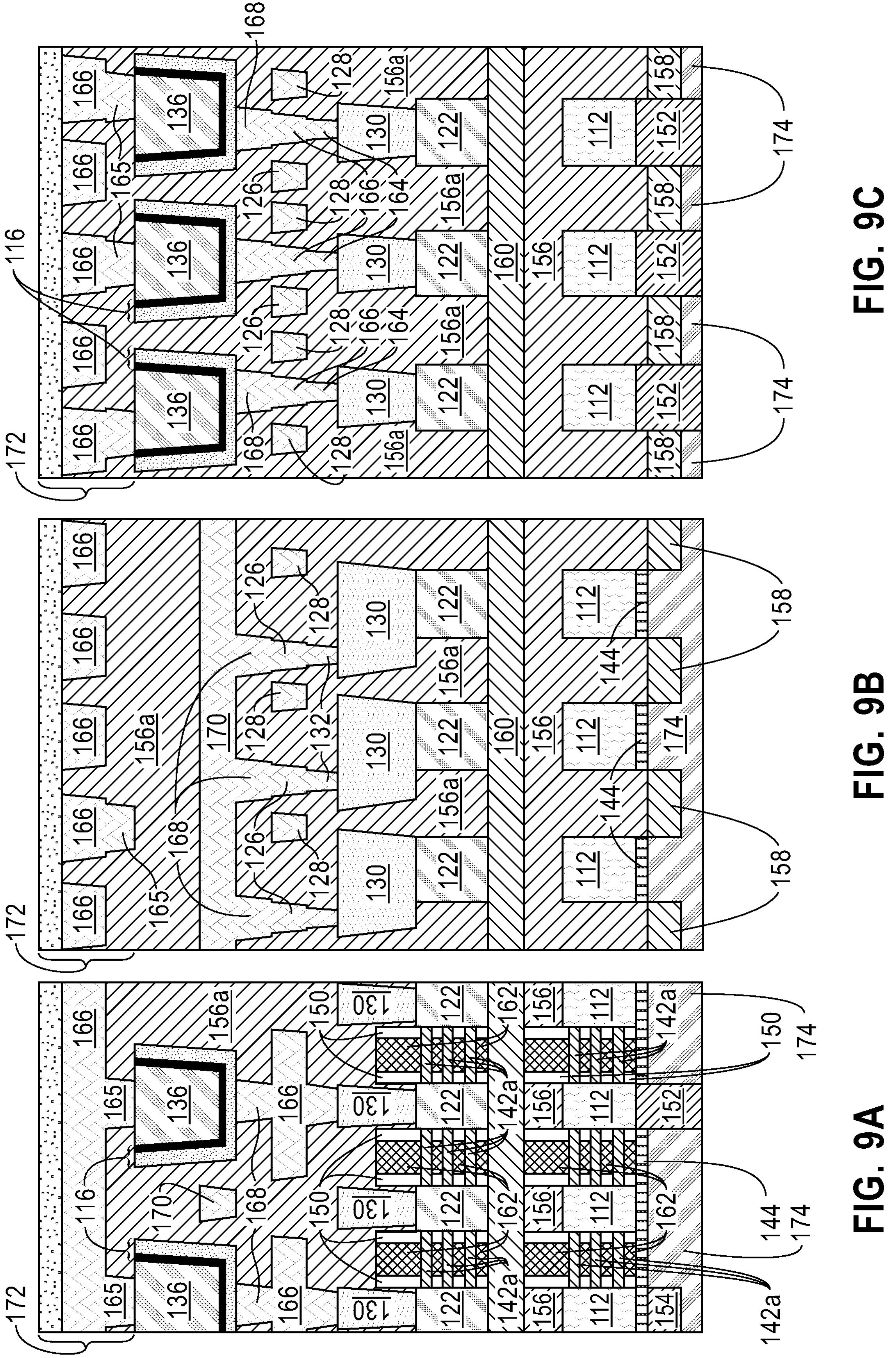
FIGS. 9A-9C depict cross-sectional side views (at the locations indicated in FIGS. 1 and 2) of the semiconductor structure at a stage of fabrication.

FIGS. 9A-9C depict cross-sectional side views (at the locations indicated in FIGS. 1 and 2) of the semiconductor structure 100 at a stage of fabrication. The semiconductor structure 100 includes a bottom interlayer dielectric (BILD) 174 that has replaced the substrate 140. The semiconductor structure 100 can be flipped and the substrate 140 can be removed using any suitable removal technique, e.g., grinding, CMP and/or wet etch, as described herein or otherwise suitable methods. A first "rough" etch step may utilize a faster grinding step that stops at the etch stop layer 138. Then the etch stop layer 138 may be removed, and the rest of the substrate 140 may be removed with a more selective, less rough etch process that does not affect the STI 158, the deep placeholders 152, or the shallow placeholders 154. The BILD 174 may then be deposited and polished with a CMP procedure that exposes the deep placeholders 152 and not the shallow placeholders 154.

Figures 10A, 10B, 10C:
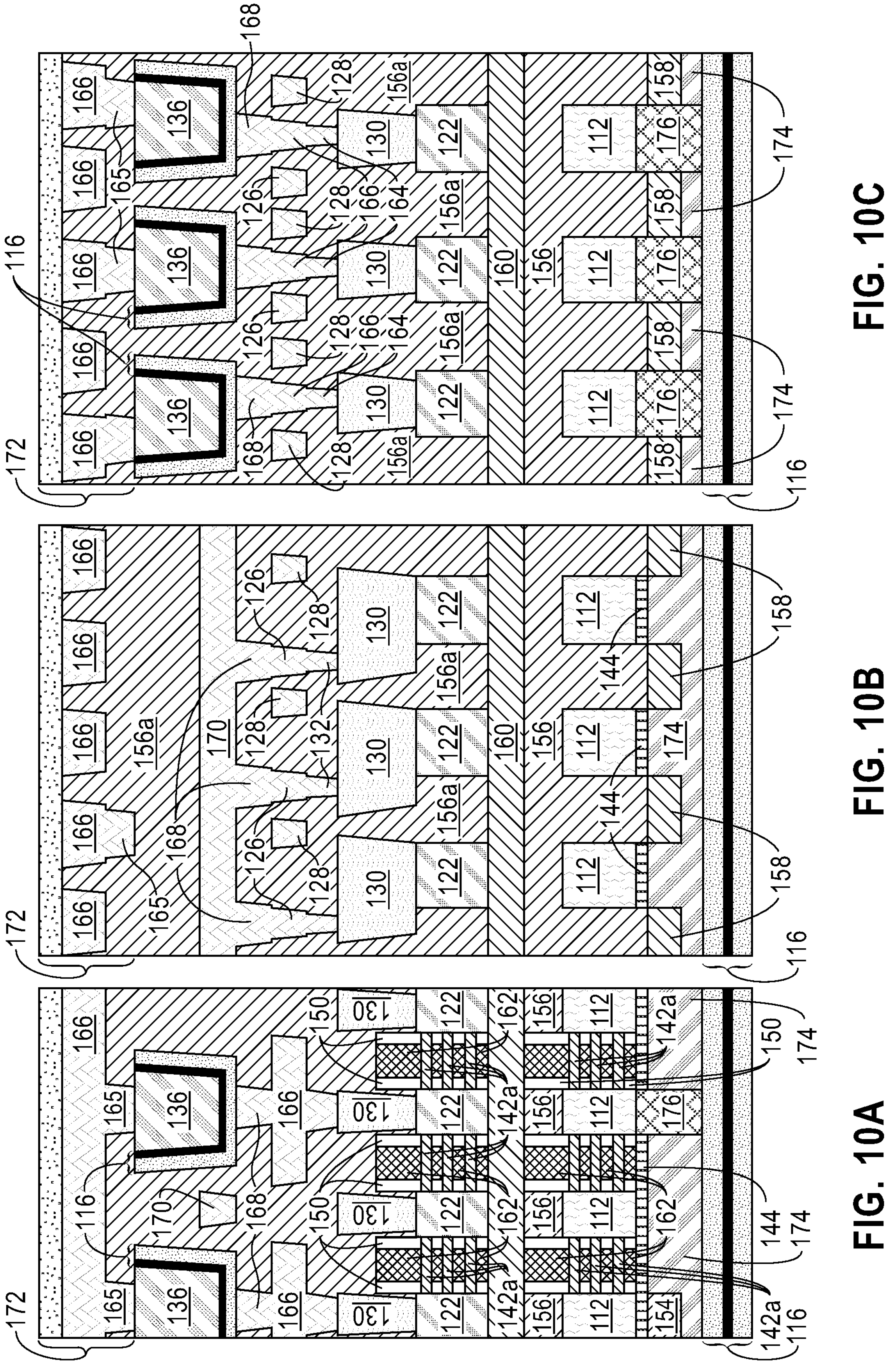
FIGS. 10A-10C depict cross-sectional side views (at the locations indicated in FIGS. 1 and 2) of the semiconductor structure at a stage of fabrication.

FIGS. 10A-10C depict cross-sectional side views (at the locations indicated in FIGS. 1 and 2) of the semiconductor structure 100 at a stage of fabrication. The semiconductor structure 100 includes a self-aligned bottom electrode (BE) 176 and bottom memory device layers 116*a*. The BE 176 is described as "self-aligned" due to the formation as a replacement of the deep placeholders 154, which are removed using a selective etch process that does not affect the BILD 174. The resulting hole from the removal of the deep placeholders 154 are filled with conductive material to form the BE 176. The semiconductor structure 100 may again be polished. Next, the bottom memory device layers 116*a* may be formed as consecutive blanket layers. The illustrated embodiment includes two electrode layers formed from material such as titanium nitride that sandwich a dielectric film such as hafnium oxide.

Figures 11A, 11B, 11C:
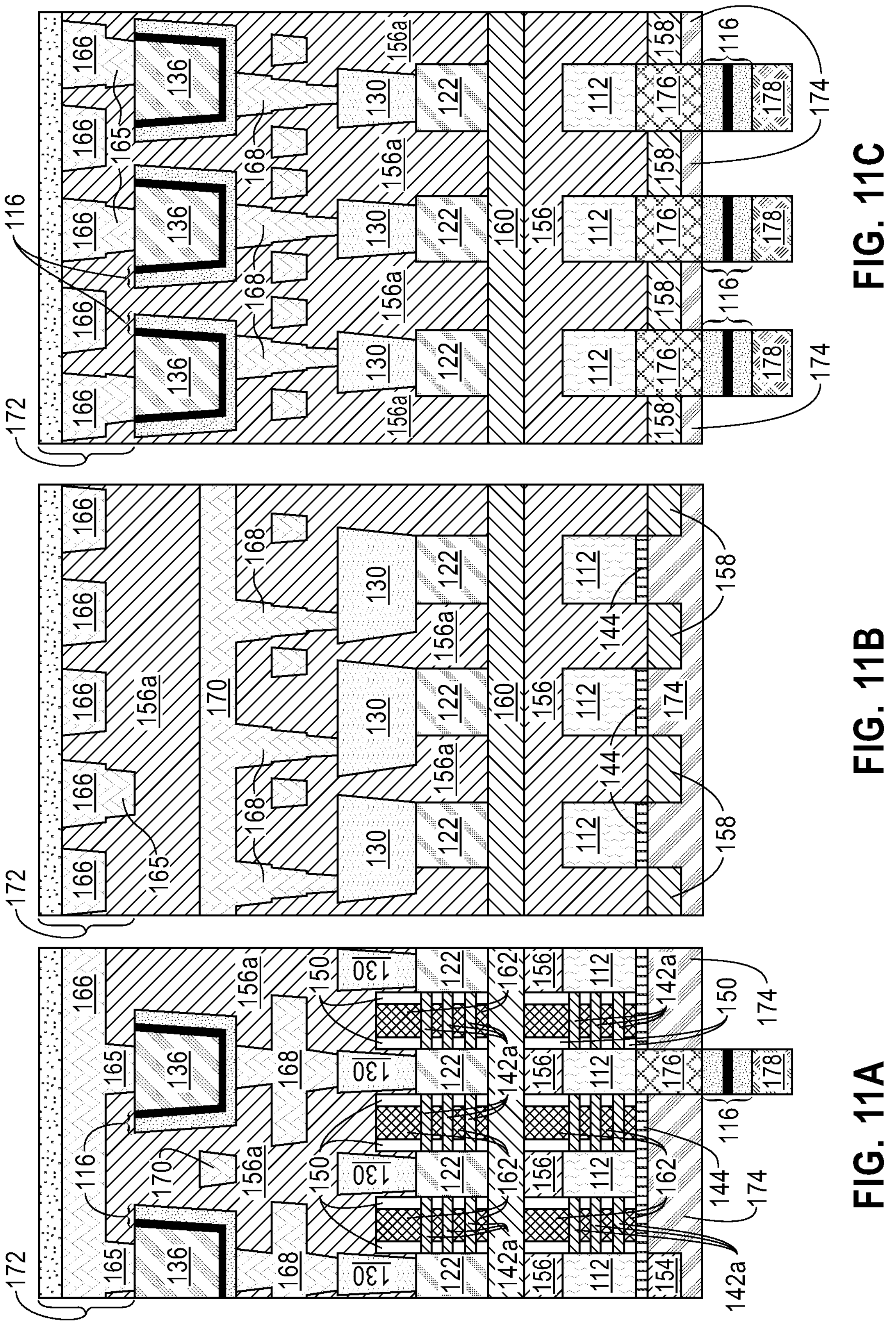
FIGS. 11A-11C depict cross-sectional side views (at the locations indicated in FIGS. 1 and 2) of the semiconductor structure at a stage of fabrication.

FIGS. 11A-11C depict cross-sectional side views (at the locations indicated in FIGS. 1 and 2) of the semiconductor structure 100 at a stage of fabrication. The semiconductor structure 100 includes bottom memory devices 116 and a hardmask 178 that is used to pattern and form the bottom memory devices 116. The hardmask 178 may include materials such as tantalum nitride that reacts to lithographic patterning to create the pattern illustrated in FIG. 11A-11C, after which the bottom memory device layers 116*a* are formed with an etch process that is blocked by the hardmask 178.

Figures 12A, 12B, 12C:
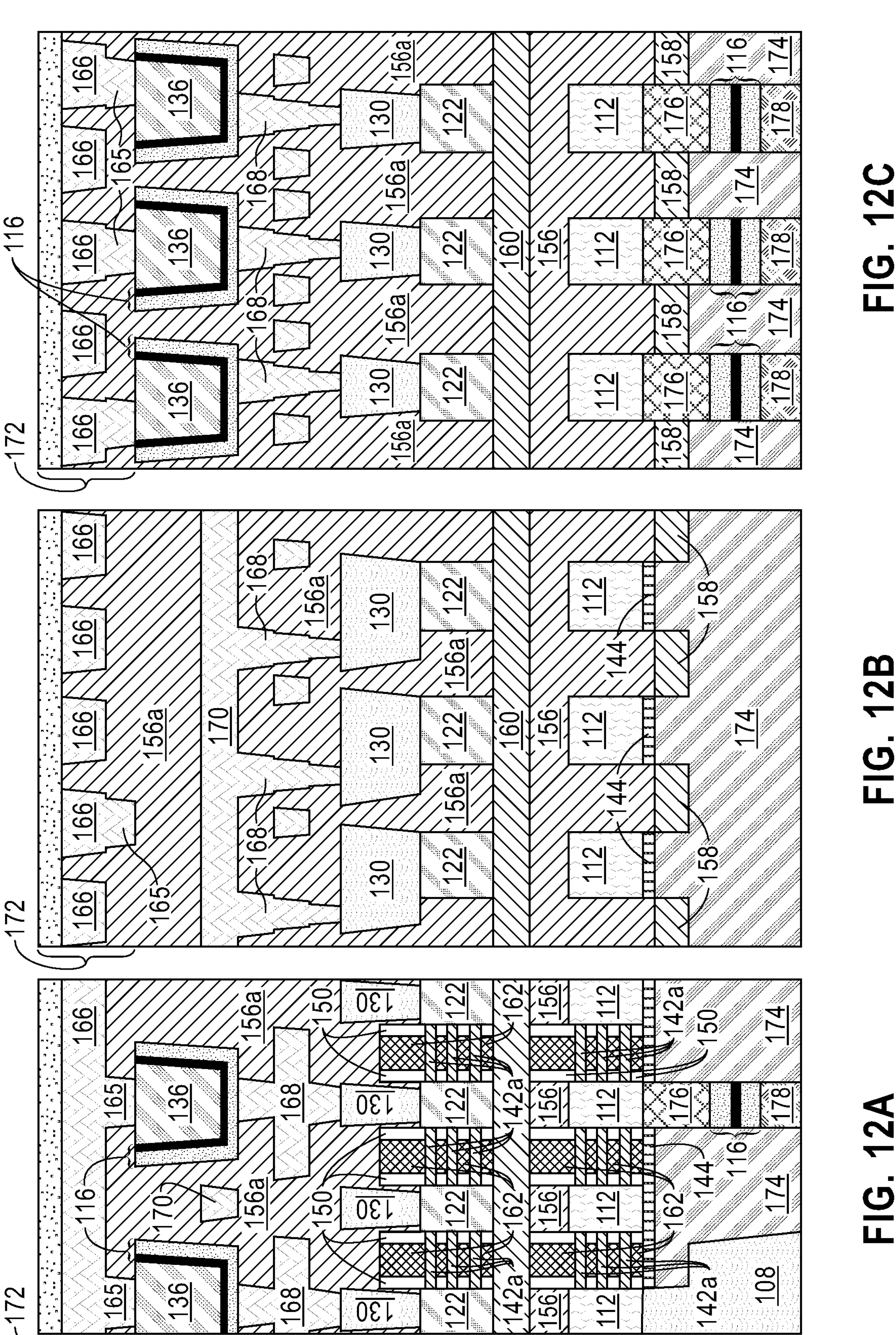
FIGS. 12A-12C depict cross-sectional side views (at the locations indicated in FIGS. 1 and 2) of the semiconductor structure at a stage of fabrication.

FIGS. 12A-12C depict cross-sectional side views (at the locations indicated in FIGS. 1 and 2) of the semiconductor structure 100 at a stage of fabrication. The semiconductor structure 100 includes the BSCAs 108 directly coupled to certain of the bottom S/Ds 112. The BSCAs 108 may be formed after additional BILD 174 has been deposited around the bottom memory devices 116, and polished (e.g., CMP) to expose the hardmask 178. A wide portion of the BSCA hole is then etched through the BILD 174 until the shallow placeholder 154 is exposed. Then the shallow placeholder 154 is removed the BSCA hole is metalized to form the BSCAs 108.

Figures 13A, 13B, 13C:
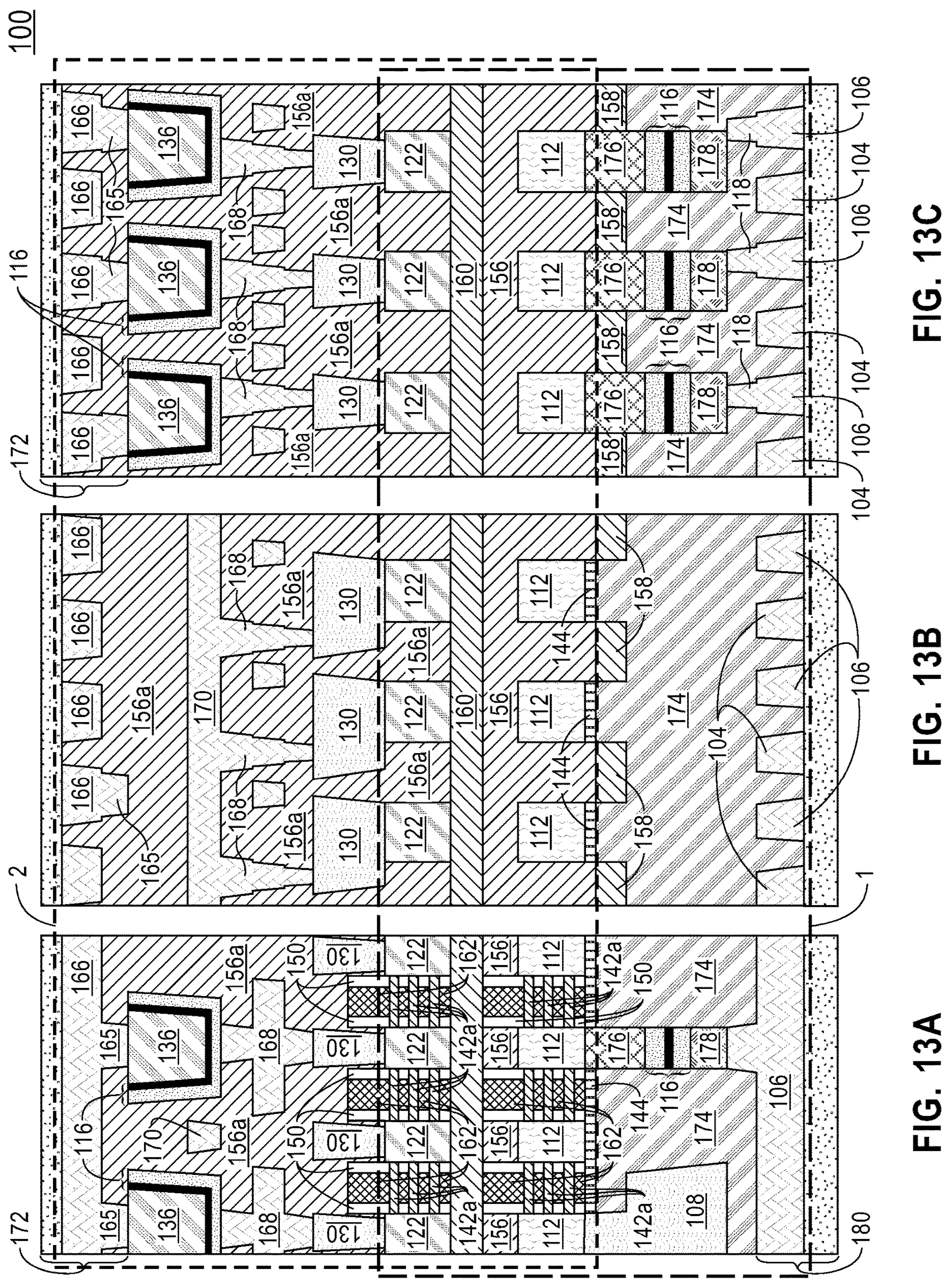
FIGS. 13A-13C depict cross-sectional side views (at the locations indicated in FIGS. 1 and 2) of the semiconductor structure at a stage of fabrication.

FIGS. 13A-13C depict cross-sectional side views (at the locations indicated in FIGS. 1 and 2) of the semiconductor structure 100 at a stage of fabrication. The semiconductor structure 100 includes the backside metal 1 layer (BSM1) level of the BSPDN in detail and the remaining levels of the BSPDN 180 in abstraction. The M1 level includes the Vss metal lines 104 and the Vdd metal lines 106 illustrated in FIG. 1. The Vdd metal lines 106 are electrically connected to the bottom memory devices 116 by the bottom memory device vias 118.

The semiconductor structure 100 thus has bottom memory devices 116 and top memory devices 136 that can differ in the type of memory that is used. For example, the bottom memory devices 116 may differ in the type or amount of voltage that is used in the top memory devices 136. In the illustrated embodiment, the top memory devices 136 operate using a source voltage that passes from the Vss metal lines 104 to one of the top transistors 164 and to one of the bitlines 126. Specifically, when the top gate 124 is open, the signal propagates through the top memory device 136, through the CA 130 into one of the top S/Ds 122, through the open top gate 124, through the other S/D and into the other CA 130 and then the bitline 126. This path is illustrated in FIG. 2, which is outlined and labeled in FIGS. 13A-C as "2".

The bottom memory devices 116 operate using a source voltage that passes from the Vss metal lines 104 to one of the bottom transistors 164 and to one of the bitlines 126. Specifically, when the two bottom gates 124 are open, the signal propagates from the Vss metal line through the BSCA 108 into one of the bottom S/Ds 112, through the first open bottom gate 114, through an unconnected bottom 112 S/D, through the second open bottom gate 114, into the other bottom S/D 112, and through the bottom memory device 116 to the Vdd metal line. This path is illustrated in FIG. 1, which is outlined and labeled in FIGS. 13A-C as "1". The path of the bottom memory devices 116 may include additional bottom gates 114 or may operate using a single bottom gate 114.

In one aspect, the method and structures as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip may be mounted in a single chip package (such as a plastic carrier, with leads that are affixed to a motherboard or other higher-level carrier) or in a multichip package (such as a ceramic carrier that has either or both surface interconnections and buried interconnections). In any case, the chip can then be integrated with other chips, discrete circuit elements, and/or other signal processing devices as part of either (a) an intermediate product, such as a motherboard, or (b) an end product. The end product can be any product that includes integrated circuit chips, ranging from low-end applications, such as toys, to advanced computer products having a display, a keyboard or other input device, and a central processor.

The descriptions of the various embodiments of the present teachings have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Importantly, although the operational/functional descriptions described herein may be understandable by the human mind, they are not abstract ideas of the operations/functions divorced from computational implementation of those operations/functions. Rather, the operations/functions represent a specification for an appropriately configured computing device. As discussed in detail above, the operational/functional language is to be read in its proper technological context, i.e., as concrete specifications for physical implementations.

Accordingly, one or more of the methodologies discussed herein may obviate a need for time consuming data processing by the user. This may have the technical effect of reducing computing resources used by one or more devices within the system. Examples of such computing resources include, without limitation, processor cycles, network traffic, memory usage, storage space, and power consumption.

It should be appreciated that aspects of the teachings herein are beyond the capability of a human mind. It should also be appreciated that the various embodiments of the subject disclosure described herein can include information that is impossible to obtain manually by an entity, such as a human user. For example, the type, amount, and/or variety of information included in performing the process discussed herein can be more complex than information that could be reasonably be processed manually by a human user.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications, and variations that fall within the true scope of the present teachings.

The components, steps, features and objects that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. An element proceeded by "a" or "an" does not, without further constraints, preclude the existence of additional identical elements in the process, method, article, or apparatus that comprises the element.

What is claimed is:

1. A semiconductor structure comprising:

a top transistor;

a bottom transistor stacked below the top transistor;

a low-voltage back-end-of-line (BEOL) memory device electrically coupled to and above the top transistor, wherein the low-voltage BEOL memory device comprises a metal-insulator-metal (MIM) capacitor; and a high-voltage backside memory device electrically coupled to and below the bottom transistor.

2. The semiconductor structure of claim 1, wherein the low-voltage memory BEOL device comprises a dynamic random access memory (DRAM) device.

3. The semiconductor structure of claim 2, wherein a first electrode of the MIM capacitor is connected to a negative supply voltage (Vss) metal line, and a second electrode of the MIM capacitor is connected to a first source/drain (S/D) epi of the top transistor.

4. The semiconductor structure of claim 3, wherein a second S/D epi of the top transistor is connected to a bitline (BL).

5. The semiconductor structure of claim 1, wherein the high-voltage backside memory device comprises a selection from the group consisting of: (i) a resistive random access memory (RRAM) device comprising a backside metal-insulator-metal (MIM) capacitor and at least one second bottom transistor, and (ii) a phase change memory (PCM) device comprising a MIM capacitor and at least one second bottom transistor.

6. The semiconductor structure of claim 5, further comprising:

a bottom electrode (BE) directly connected to a first electrode of the MIM capacitor, wherein the BE is self-aligned to a first source/drain (S/D) epi of the at least one second bottom transistor; and a backside metal-1 layer (BSM1) comprising a Vdd line electrically coupled to a second electrode of the MIM capacitor.

7. The semiconductor structure of claim 6, wherein a second S/D epi of the second bottom transistor is connected to a Vss line of the BSM1 layer.

8. The semiconductor structure of claim 1, wherein the bottom transistor comprises at least two gates separated by an unconnected source/drain.

9. A semiconductor structure, comprising:

a top transistor; and a bottom transistor positioned directly below the top transistor, comprising:

a first source/drain (S/D) electrically connected to a backside S/D contact;

an unconnected S/D;

a second S/D electrically connected to a bottom memory device;

a first gate between the first S/D and the unconnected S/D; and a second gate between the unconnected S/D and the second S/D.

10. The semiconductor structure of claim 9, wherein the bottom memory device comprises a selection from the group consisting of: (i) a resistive random access memory (RRAM) device comprising a metal-insulator-metal (MIM) capacitor and at least one second bottom transistor, and (ii) a phase change memory (PCM) device comprising a MIM capacitor and at least one second bottom transistor.

11. The semiconductor structure of claim 9, further comprising:

a bottom electrode (BE) directly connected to a first electrode of the bottom memory device, wherein the BE is self-aligned to a first source/drain (S/D) epi of the second bottom transistor; and a backside metal 1 layer (BSM1) comprising a Vdd line electrically coupled to a second electrode of the bottom memory device through a backside via contact (BSVA).

12. The semiconductor structure of claim 9, further comprising a top memory device electrically connected to the top transistor.

13. The semiconductor structure of claim 9, wherein the first gate comprises a high-K metal gate surrounding nanosheet channels.

14. The semiconductor structure of claim 9, further comprising a backside power delivery network below the backside S/D contact and the bottom memory device.

* * * * *